United States Patent
Park

(10) Patent No.: US 9,224,836 B2
(45) Date of Patent: Dec. 29, 2015

(54) SEMICONDUCTOR DEVICE HAVING VERTICAL CHANNEL, RESISTIVE MEMORY DEVICE INCLUDING THE SAME, AND METHOD OF MANUFACTURING THE SAME

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/704,671

(22) Filed: May 5, 2015

(65) Prior Publication Data

US 2015/0236126 A1 Aug. 20, 2015

Related U.S. Application Data

(62) Division of application No. 14/074,404, filed on Nov. 7, 2013, now Pat. No. 9,054,033.

(30) Foreign Application Priority Data

Aug. 19, 2013 (KR) .................. 10-2013-0097806

(51) Int. Cl.
| | | |
|---|---|---|
| H01L 21/336 | (2006.01) | |
| H01L 29/66 | (2006.01) | |
| H01L 27/24 | (2006.01) | |

(52) U.S. Cl.
CPC ...... *H01L 29/66666* (2013.01); *H01L 27/2454* (2013.01)

(58) Field of Classification Search
CPC .............................. H01L 21/762; H01L 29/78

USPC ........ 438/585; 257/2, 365, E29.264, E21.545
See application file for complete search history.

(56) References Cited

U.S. PATENT DOCUMENTS

| | | | |
|---|---|---|---|
| 8,237,226 B2* | 8/2012 | Okano | 257/368 |
| 8,946,670 B1 | 2/2015 | Park | |
| 2007/0295995 A1* | 12/2007 | Yun et al. | 257/202 |
| 2008/0296632 A1* | 12/2008 | Moroz et al. | 257/255 |
| 2009/0032849 A1 | 2/2009 | Higashino | |
| 2009/0085062 A1* | 4/2009 | Jin et al. | 257/190 |
| 2009/0166725 A1* | 7/2009 | Lee | 257/329 |
| 2009/0256208 A1* | 10/2009 | Okano | 257/365 |
| 2009/0294845 A1 | 12/2009 | Inagawa et al. | |
| 2010/0127327 A1* | 5/2010 | Chidambarrao | 257/347 |
| 2010/0140688 A1 | 6/2010 | Fujimoto | |
| 2010/0187578 A1* | 7/2010 | Faltermeier et al. | 257/288 |

(Continued)

OTHER PUBLICATIONS

Notice of Allowance issued by the USPTO for a continuation-in-part U.S. Appl. No. 14/460,204 of the parent U.S. Appl. No. 14/074,404 on Oct. 29, 2015.

*Primary Examiner* — Caleb Henry
(74) *Attorney, Agent, or Firm* — IP & T Group LLP

(57) ABSTRACT

A semiconductor device, a resistive memory device including the same, and a method of manufacturing the same are provided. The semiconductor device includes a pillar extending substantially perpendicular from a semiconductor substrate, the pillar including an inner portion and an outer portion surrounding the inner portion. A junction region is formed in an upper region and a lower region of the vertical pillar, and a gate surrounds the pillar. The inner portion of the pillar includes a semiconductor layer having a lattice constant that is larger than a lattice constant of the outer portion of the pillar.

5 Claims, 8 Drawing Sheets

(56) References Cited

U.S. PATENT DOCUMENTS

| | | |
|---|---|---|
| 2010/0207172 A1* | 8/2010 | Masuoka et al. .............. 257/255 |
| 2010/0219482 A1* | 9/2010 | Masuoka et al. .............. 257/369 |
| 2010/0264485 A1 | 10/2010 | Masuoka et al. |
| 2011/0073952 A1* | 3/2011 | Kwok et al. .................. 257/368 |
| 2011/0186797 A1* | 8/2011 | Herner ............................. 257/2 |
| 2012/0056256 A1 | 3/2012 | Mikasa |
| 2012/0056264 A1* | 3/2012 | Anderson et al. ............. 257/347 |
| 2012/0080742 A1 | 4/2012 | Fujimoto |
| 2013/0037869 A1 | 2/2013 | Okano |
| 2013/0181274 A1 | 7/2013 | Saitoh et al. |
| 2013/0234204 A1* | 9/2013 | Kang et al. .................... 257/190 |
| 2014/0061778 A1 | 3/2014 | Myung et al. |
| 2014/0061815 A1* | 3/2014 | Jagannathan et al. ........ 257/369 |
| 2014/0084342 A1* | 3/2014 | Cappellani et al. ........... 257/192 |
| 2014/0361233 A1 | 12/2014 | Kim |
| 2014/0374827 A1* | 12/2014 | Suh et al. ...................... 257/347 |
| 2015/0014775 A1* | 1/2015 | Seo et al. ...................... 257/351 |
| 2015/0048292 A1* | 2/2015 | Park ................................. 257/2 |
| 2015/0048294 A1 | 2/2015 | Park |
| 2015/0048295 A1* | 2/2015 | Park ................................. 257/2 |
| 2015/0048296 A1* | 2/2015 | Park ................................. 257/2 |
| 2015/0091070 A1* | 4/2015 | Cho et al. ...................... 257/306 |
| 2015/0123193 A1 | 5/2015 | Masuoka et al. |
| 2015/0243666 A1 | 8/2015 | Shimamoto |
| 2015/0243707 A1 | 8/2015 | Park |

\* cited by examiner

SEMICONDUCTOR DEVICE HAVING VERTICAL CHANNEL, RESISTIVE MEMORY DEVICE INCLUDING THE SAME, AND METHOD OF MANUFACTURING THE SAME

CROSS-REFERENCES TO RELATED APPLICATION

This application is a division of U.S. patent application Ser. No. 14/074,404 filed on Nov. 7, 2013, which claims priority under 35 U.S.C. 119(a) to Korean application No. 10-2013-0097806, filed on Aug. 19, 2013, in the Korean intellectual property Office. The disclosure of each of the foregoing application is incorporated by reference in its entirety as set forth in full.

BACKGROUND

1. Technical Field

Various embodiments of the inventive concept relate to a semiconductor integrated circuit device and a method of manufacturing the same, and, more particularly, to a semiconductor device having a vertical channel, a resistive memory device including the same, and a method of manufacturing the same.

2. Related Art

With the rapid development of mobile and digital information communication and the consumer-electronics industry, electronic charge controlled-devices may encounter limitations. Thus, new functional memory devices need to be developed. In particular, next-generation memory devices with large capacities, ultra-high speeds, and ultra-low powers need to be developed to satisfy demands of large capacity memories.

The use of resistive memory devices using a resistance device as a memory medium has been suggested as the next-generation of memory devices. Examples of resistance variable memory device may include phase-change random access memories (PCRAMs) resistive RAMs (ReRAMs), or magento resistive RAMs (MRAMs).

A resistive memory device may be formed of a switching device and a resistance device and may store data "0" or "1," according to a state of the resistance device.

Even in the variable resistive memory device, the first priority is to improve integration density and to integrate as many memory cells as possible in a limited and small area.

To satisfy these demands, the resistive memory device also employs a three-dimensional (3D) transistor structure. The 3D transistors may include a channel extending to a direction substantially perpendicular to a surface of a semiconductor substrate and a surrounded gate formed to surround the channel.

The 3D transistors may require a high operation current to maintain high resistance variable characteristics.

SUMMARY

An exemplary semiconductor device may include a pillar extending substantially perpendicular from a semiconductor substrate, the pillar including an inner portion and an outer portion surrounding the inner portion; a junction region formed in an upper region and a lower region of the vertical pillar; and a gate surrounding the pillar, wherein the inner portion of the pillar includes a semiconductor layer having a lattice constant that is larger than a lattice constant of the outer portion of the pillar.

An exemplary resistive memory device may include a pillar including a channel region; a source formed in a source region located below the channel region; a drain formed in a drain region located on the channel region; a gate surrounding an outer circumference of the pillar; a heating electrode located over the drain; and a variable resistance layer located on the heating electrode, wherein the channel region of the pillar is subjected to a tensile stress based on a junction with the source region or the drain region.

An exemplary method of manufacturing a semiconductor device may include forming a first semiconductor layer on a semiconductor substrate, the first semiconductor layer having a lattice constant that is larger than a lattice constant of the semiconductor substrate; patterning the first semiconductor layer and the semiconductor substrate to form a preliminary pillar; forming a pillar by forming a second semiconductor layer having a same type of material as the semiconductor substrate on an outer circumference of the preliminary pillar; forming a gate insulating layer on the pillar and the semiconductor substrate; forming a drain in an upper portion of the pillar; forming, below the pillar, a source in the semiconductor substrate; and forming a gate surrounding an outer circumference of the pillar.

An exemplary microprocessor may include a control unit configured to receive an external signal from an external source and generate a control signal based on the external signal; an operation unit configured to perform an operation based on the control signal; and a storage unit configured to store data associated with the microprocessor or an address of data associated with the microprocessor, wherein the storage unit includes a transistor including a pillar having an inner portion and an outer portion surrounding the inner portion, wherein the inner portion and the outer portion have different lattice constants.

An exemplary processor may include a core unit configured to perform an operation based on a command input from an external source; a cache memory unit configured to store data associated with the processor or an address of data associated with the microprocessor; and a bus interface configured to interconnect the core unit and the cache memory unit, and to transmit data between the core unit and the cache memory device unit, wherein the cache memory unit includes a transistor including a pillar having an inner portion and an outer portion surrounding the inner portion, wherein the inner portion and the outer portion have different lattice constants.

An exemplary system may include a processor configured to receive an external signal from an external source and perform an operation based on the external signal; an auxiliary storage device configured to store data to be used by the processor; a main storage device configured to transfer the data the auxiliary storage device and store the data for use by the processor when the processor performs the operation; and an interface device configured to communicate between the external source and the processor, the auxiliary storage device, or the main storage device, wherein at least one of the auxiliary storage device and the main storage device includes a transistor including a pillar having an inner portion and an outer portion surrounding the inner portion, wherein the inner portion and the outer portion have different lattice constants.

These and other features, aspects, and exemplary implementations are described below in the section entitled "DETAILED DESCRIPTION".

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DETAILED DESCRIPTION

Figure 1:
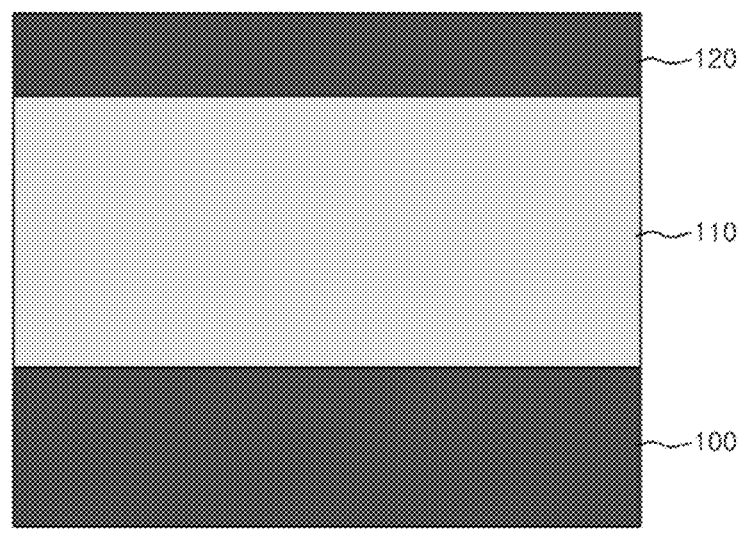
FIGS. 1 to 5 are cross-sectional views illustrating an exemplary method of manufacturing a semiconductor device having a vertical channel.

Hereinafter, exemplary implementations will be described in greater detail with reference to the accompanying drawings. Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

The inventive concept is described herein with reference to cross-section and/or plan illustrations that are schematic illustrations of exemplary implementations of the inventive concept. However, exemplary implementations of the inventive concept should not be construed as being limited to the illustrated exemplary implementations. It will be appreciated by those of ordinary skill in the art that changes may be made to the illustrated exemplary implementations without departing from the principles and spirit of the inventive concept.

Referring to FIG. 1, a semiconductor substrate 100 is prepared. The semiconductor substrate 100 may be, for example, a silicon (Si) substrate containing a first conductive impurity, such as a P-type impurity. A first semiconductor layer 110 and a second semiconductor layer 120 are sequentially deposited on the semiconductor substrate 100. The first semiconductor layer 110 may be formed of a material having a lattice constant larger than that of the semiconductor substrate 100. In an exemplary implementation, the first semiconductor layer 110 may include, for example, silicon germanium (Site), gallium arsenide (GaAs), indium arsenide (InAs), gallium antimonide (GaSb), indiumantimonide (InSb), indium phosphide (InP), magnesium sulfide (MgS), magnesium selenide (MgSe), zinc sulfide (ZnS), zinc selenide (ZnSe), zinc telluride (ZnTe), aluminum phosphide (AlP), gallium phosphide (GaP), aluminum arsenide (AlAs), aluminum antimonide (AlSb), cadmium sulfide (CdS), cadmium antimonide (CdSb), or cadmium telluride (CdTe). The first semiconductor layer 110 may be a region in which a substantial channel is to be formed in a subsequent process. A thickness of the first semiconductor layer 110 may be based on a length of the channel, and, for example, the first semiconductor layer 110 may be grown in a single crystalline structure through an epitaxial growth method. As the first semiconductor layer 110 is formed through an epitaxial growth method, carrier mobility characteristics may be improved as compared to a semiconductor layer having a polycrystalline structure.

The second semiconductor layer 120 may be formed on the first semiconductor layer 110. The second semiconductor layer 120 may be formed of the same material as the semiconductor substrate 100, for example, silicon (Si). The semiconductor layer 120 may be a region in which a drain region is to be formed in a subsequent process, and a length of the second semiconductor layer 120 may be based on a width of the drain region.

Figure 2:
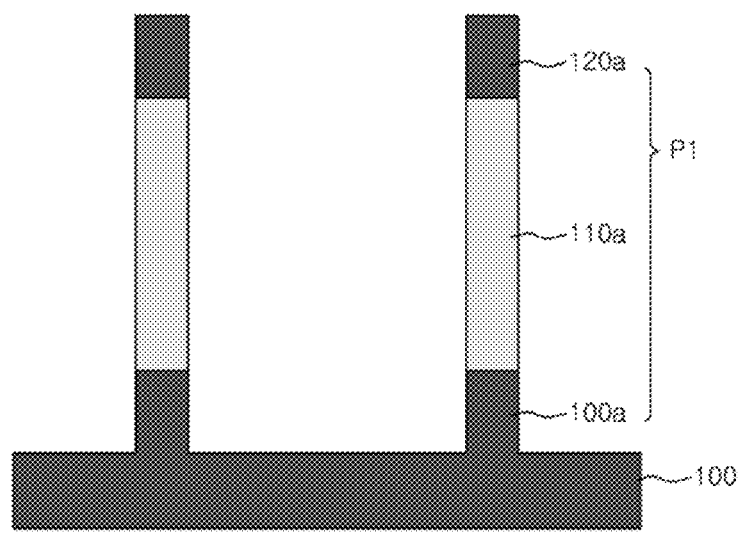

Referring to FIG. 2, the second semiconductor layer 120, the first semiconductor layer 110, and a portion of the semiconductor substrate 100 are patterned to form a preliminary pillar P1. The preliminary pillar P1 may have a line width smaller than an expected width of a vertical channel structure. The reference numeral 120a denotes a patterned second semiconductor layer, 110a denotes a patterned first semiconductor layer, and 100a denotes a patterned portion of the semiconductor substrate.

Figure 3:
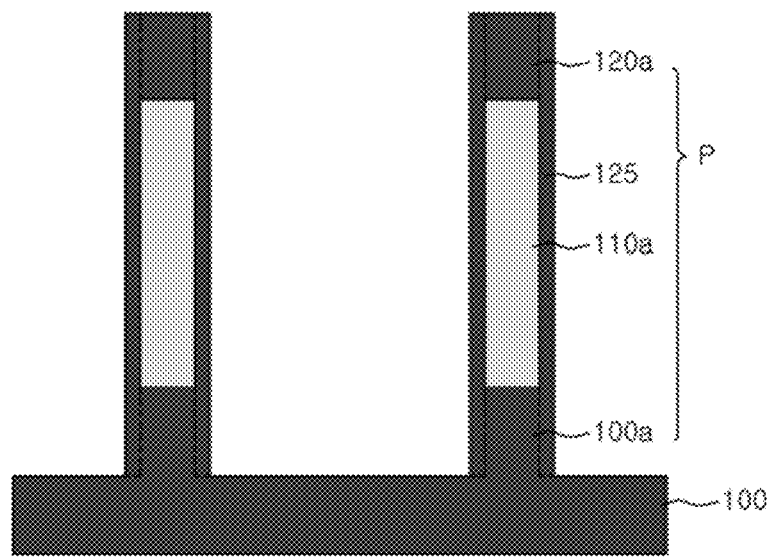

Referring to FIG. 3, a third semiconductor layer 125 having a lattice constant smaller than that of the first semiconductor layer 110 is formed on an outer wall of the preliminary pillar P1. For example, the third semiconductor layer 125 may be formed of the same material (such as silicon (Si)) as the semiconductor substrate 100 and the second semiconductor layer 120. The third semiconductor layer 125 may be formed using an epitaxial growth method. As the third semiconductor layer 125 is formed, the first patterned semiconductor layer 110a may be surrounded with a semiconductor material (for example, a silicon (Si) material) having a smaller lattice constant than that of the first patterned semiconductor layer 110a. Therefore an inner portion (corresponding to the first patterned semiconductor layer 110a) of the pillar P, which forms a substantial channel region, may be formed of a semiconductor material having a larger lattice constant than that of an outer portion (the semiconductor substrate, the second semiconductor layer, and the third semiconductor layer) of the pillar P.

Figure 4:
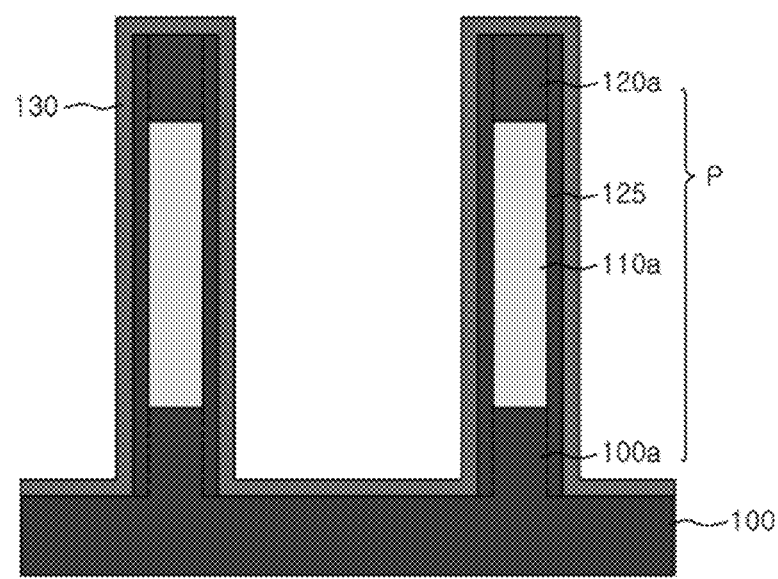

Referring to FIG. 4, an oxidation process is performed on the pillar P and the exposed upper surface of the semiconductor substrate 100 to form a gate insulating layer 130. Although the gate insulating layer 130 in the exemplary implementation is formed through an oxidation process, this is not limited thereto, and the gate insulating layer 130 may be formed through a deposition method. If the gate insulating layer 130 is formed through a deposition method, then the gate insulating layer 130 may include a metal oxide, such as such as tantalum oxide (TaO), titanium oxide (TiO), barium titanate (BaTiO), barium zirconate (BaZrO), zirconium oxide (ZrO), hafnium oxide (HfO), lanthanum oxide (Lao), aluminum oxide (AlO), yttrium oxide (YO), zirconium silicide oxide (ZrSiO), nitride, or a combination thereof.

Figure 5:
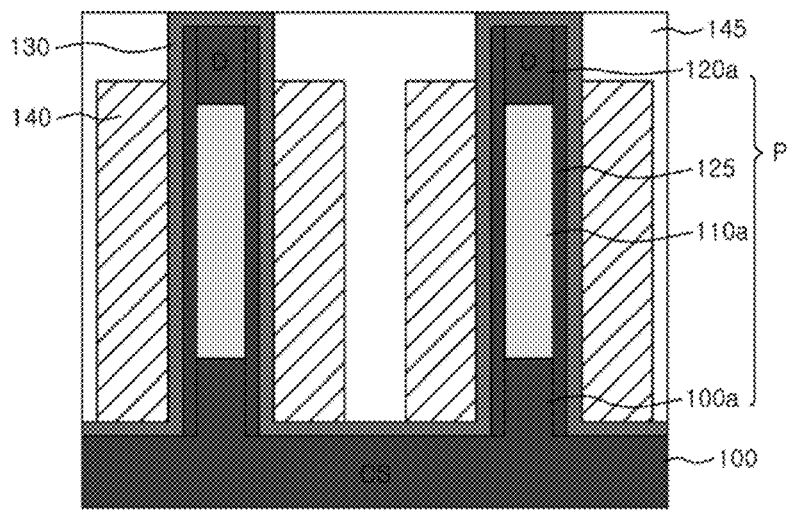

Referring to FIG. 5, a second conductive impurity, such as an N-type impurity may be implanted in a high concentration into an upper portion and a lower portion of the pillar P to form a drain D in the upper portion of the pillar P and form a source in the lower portion of the pillar P. The source may be formed in the entire semiconductor substrate (for example, a region corresponding to an active region) to operate as a common source CS. The drain D may be formed in a lightly doped drain (LDD) manner to reduce a short channel effect, such as gate-induced drain leakage (GIDL), and the drain D may be formed in the second patterned semiconductor layer 120a. Next, a surrounded gate 140 may be formed on an outer circumference of the pillar P. The surrounded gate 140 may be formed to have a height lower than the pillar P. The surrounded gate 140 may include, for example, tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum itride (TaAlN), titanium (Ti) molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), tantalum oxynitride (TaON), or doped polysilicon. The surrounded gate 140 may be formed, for example, using an anisotropic etching method. Next, an interlayer insulating layer 145 may be formed to be formed to be buried in the semiconductor substrate including the surrounded gate 140

Figure 6:
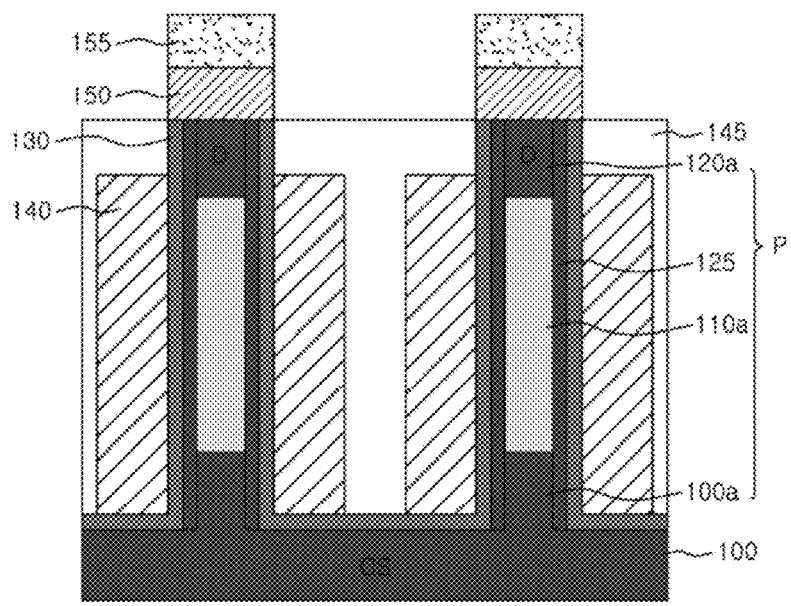
FIG. 6 is a cross-sectional view illustrating an exemplary resistive memory device including a semiconductor device having a vertical channel.

As illustrated in FIG. 6, a heating electrode 150 and a variable resistance layer 155 are sequentially formed on the drain D to form a resistive memory device. The heating electrode 150 and the variable resistance layer 155 may be formed by sequentially forming a heating electrode layer and a variable resistance layer on the semiconductor substrate, including the interlayer insulating layer 145 and patterning a heating electrode layer (not shown) and a variable resistance layer (not shown) to remain in a location in which the heating electrode 150 is electrically coupled to the drain. If the heating electrode 150 includes a metal layer, then an ohmic contact layer (not shown) may be interposed [between what?].

Figure 7:
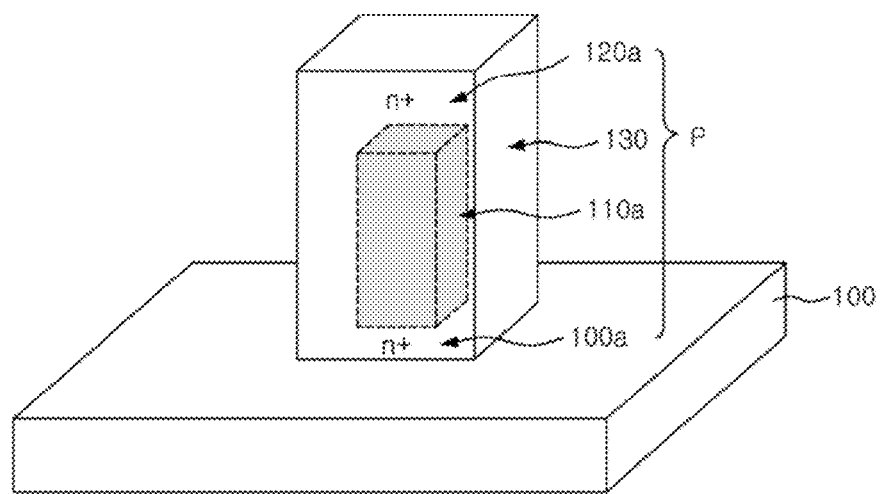
FIG. 7 is a perspective view illustrating an exemplary semiconductor device having a vertical channel.

As illustrated in FIG. 7, a vertical channel transistor may be formed so that a portion, in which a channel of the vertical channel P is formed, has a lattice constant that is larger than a lattice constant in regions in which junction regions (the source and drain) are formed. Therefore, tensile stress may be applied to the first patterned semiconductor layer 110a due to differences of the lattice constants between the semiconductor substrate 100 and the first patterned semiconductor layer 110a and between the first patterned semiconductor layer 110a and the second patterned semiconductor layer 120a. If the tensile stress is provided to the inner portion of the pillar P, that is, the first patterned semiconductor layer 110a, then an electron mobility of an NMOS transistor may be considerably increased. Thus, a current drivability of the NMOs transistor may be improved. Further, the first patterned semiconductor layer 110a is surrounded with the third semiconductor layer 130, which has a lattice constant that is less than the lattice constant of the first patterned semiconductor layer 110a, to further increase the tensile stress due to a lateral junction between the first patterned semiconductor layer 110a and the third semiconductor layer.

Figure 8:
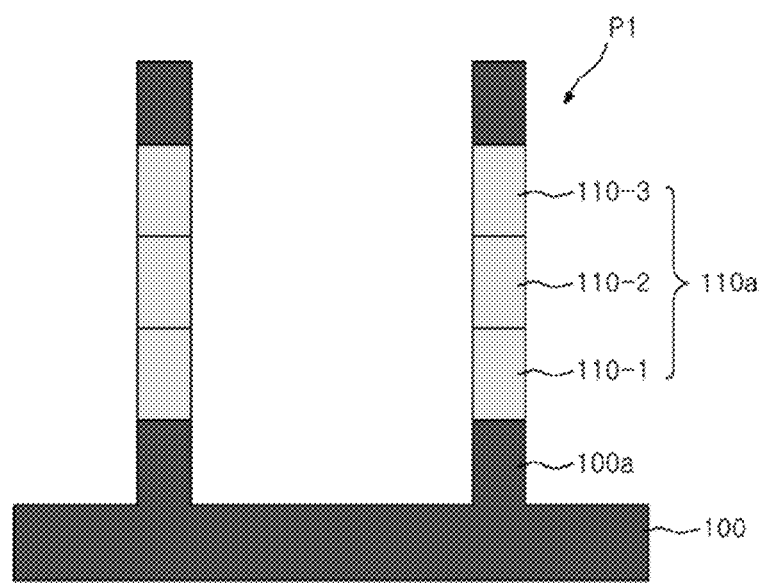
FIGS. 8 to 10 are cross-sectional views illustrating an exemplary method of manufacturing the semiconductor device having a vertical channel.

In an alternative exemplary implementation, as illustrated in FIG. 8, a first patterned semiconductor layer 110a of a preliminary pillar P1 may be configured of a stacking layer including a first sub-semiconductor layer 110-1, a second sub-semiconductor layer 110-2, and a third sub-semiconductor layer 110-3. If the first patterned semiconductor layer 110a is formed of SiGe, then the first sub-semiconductor layer 110-1 and the third sub-semiconductor layer 110-3 may be a SiGe layer (hereinafter, referred to as a low-Ge-concentration SiGe layer) having a concentration of Ge that is less than a concentration of Ge that forms a stoichiometric ratio of SiGe, and the second sub-semiconductor layer 110-2 may be a SiGe layer (hereinafter, referred to as a high-Ge-concentration-SiGe layer) having a concentration of Ge that is greater than a concentration of Ge that forms a stoichiometric ratio of SiGe. When content of Ge in the SiGe layer is increased, the lattice constant of the SiGe layer tends to increase. Therefore, a material having the largest lattice constant is formed in an effective channel zone of the first semiconductor layer 110a to maximize electron mobility in the channel.

Figure 9:
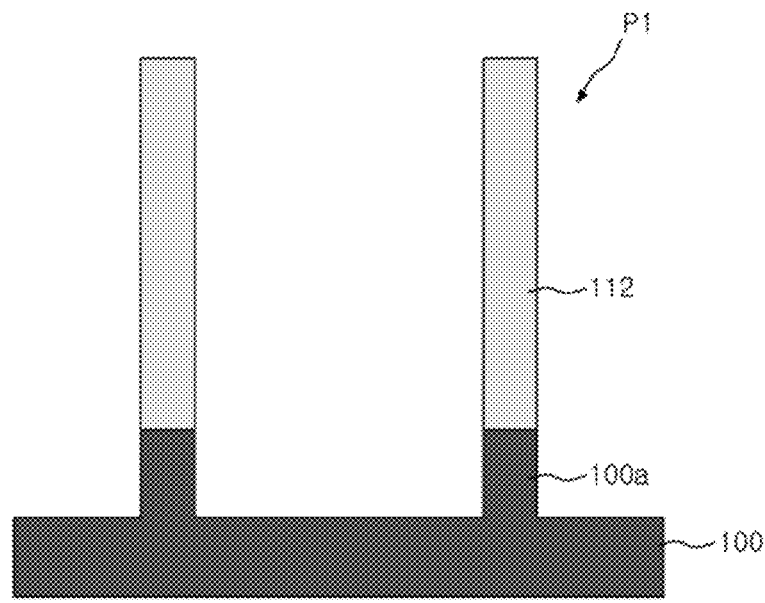

In an alternative implementation, illustrated in FIG. 9, a preliminary pillar P1 may include the patterned portion of the semiconductor substrate 100a and a first patterned semiconductor layer 112. In this alternative implementation, the second patterned semiconductor layer 120a of FIG. 2 is not included. Therefore, the drain may be formed in an upper portion of the first patterned semiconductor layer 112.

Figure 10:
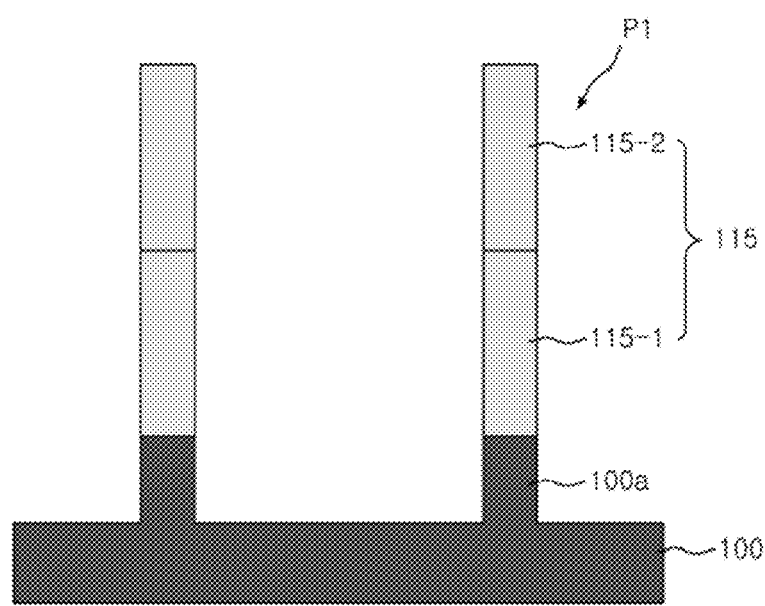

As illustrated in FIG. 10, a first patterned semiconductor layer 115 form a preliminary pillar P1 (as described in FIG. 9) without the second patterned semiconductor layer 120a of FIG. 2. The first patterned semiconductor layer 115 may be configured of a Low-Ge-concentration-SiGe layer 115-1 and a high-Ge-concentration-SiGe layer 115-2. The configuration of the first patterned semiconductor layer 115 may increase a lattice constant of a channel layer of a drain side to improve a drain current.

According to the exemplary implementations, the inner portion of the pillar having the inner portion and the outer portion, which a channel is substantially formed, may be configured of a material having a larger lattice constant than that of the outer portion. Therefore, a channel mobility of the NMOS transistor, that is, a current drivability of the NMOS transistor may be improved remarkably according to application of tensile stress to the inner portion of the pillar.

Figure 11:
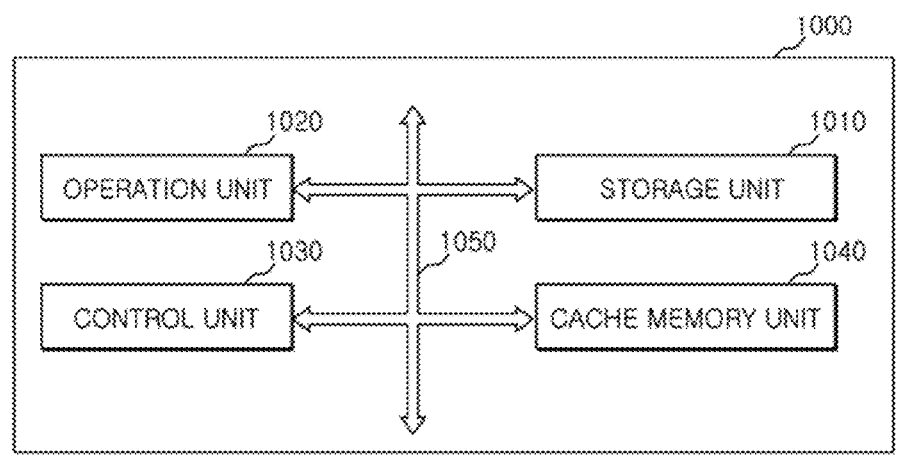
FIG. 11 is a block diagram illustrating an exemplary microprocessor.

As illustrated in FIG. 11, an exemplary microprocessor 1000 may include an exemplary semiconductor device. The microprocessor 100 may control and adjust a series of processes, which receive and process data from an external source, and may communicate a processing result to the external source, and include a storage unit 1010, an operation unit 1020, or a control unit 1030. The microprocessor 1000 may include a variety of processors, such as a central processing unit (CPU), a graphic processing unit (GPU) a digital signal processor (DSP), or an application processor (AP).

The storage unit 1010 may include a processor register or register and may store data in the microprocessor 1000. The storage unit 1010 may include a data register, an address register, or a floating point register. The storage unit 1010 may include various registers other than the above-described registers. The storage unit 1010 may function to temporarily store data to be operated in the operation unit 1020, resulting data processed in the operation unit 1020, or an address in which data to be processed is stored.

The storage unit 1010 may include an exemplary semiconductor device. The storage unit 1010 including the exemplary semiconductor device may include a 3D semiconductor device in which an inner portion of a vertical channel has a larger lattice constant than an outer portion of the channel.

The operation unit 1020 may perform an operation inside the microprocessor 1000, and may perform arithmetic or logic operations, depending on a decryption result of a command in a control unit 1030. The operation unit 1020 may include one or more arithmetic and logic units (ALUs).

The control unit 1030 may receive a signal from the storage unit 1010, the operation unit 1020, or an external source, and may perform extraction or decryption of a command, or input or output control, or execute a process of a program form.

The exemplary microprocessor 1000 may further include a cache memory unit 1040 that may temporarily store data input from an external source or data to be output to an external source other than the storage unit 1010. At this time, the cache memory unit 1040 may exchange data with the storage unit 1010, the operation unit 1020, or the control unit 1030 through a bus interface 1050.

Figure 12:
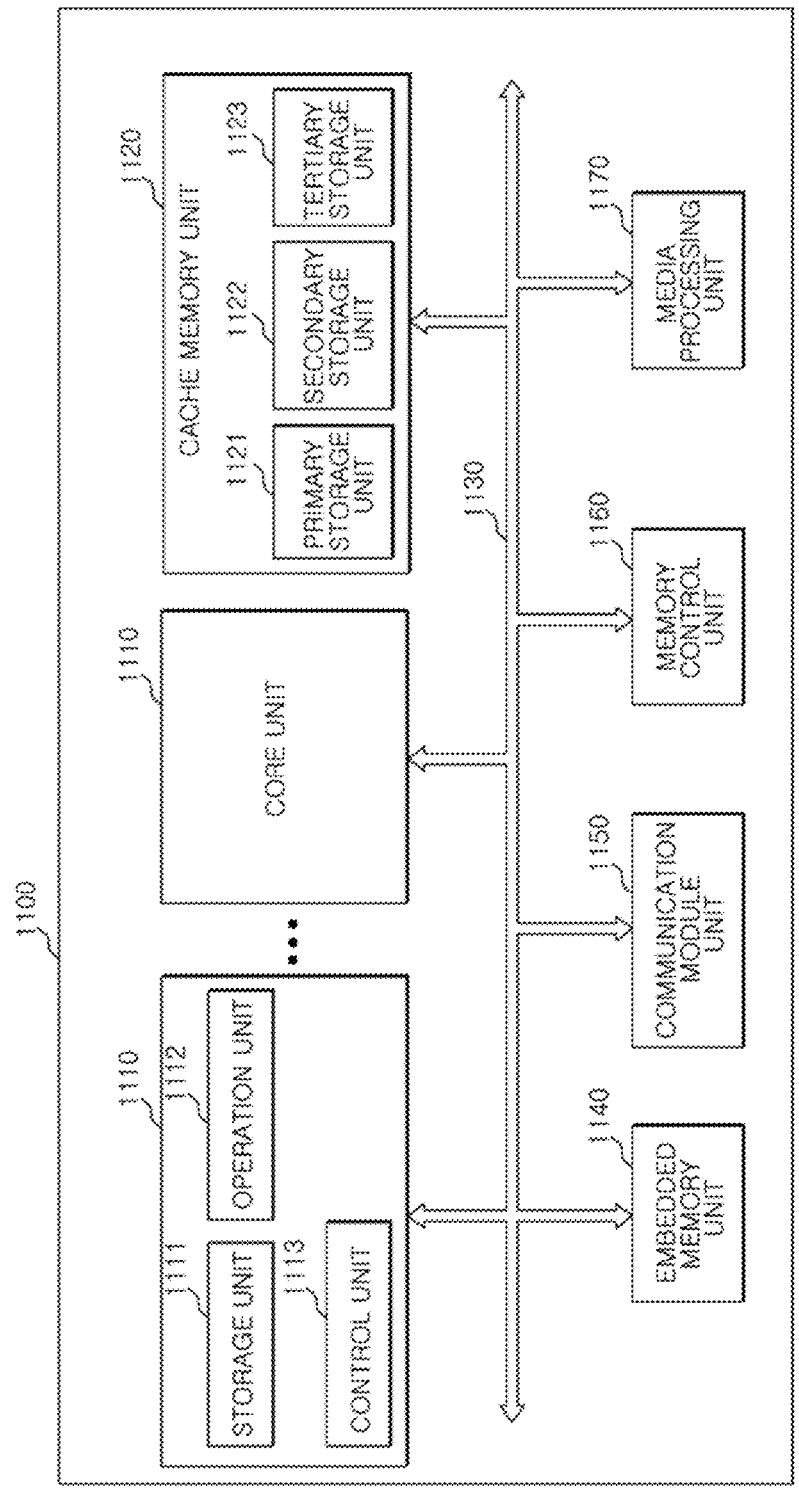
FIG. 12 is a block diagram illustrating an exemplary processor.

As illustrated in FIG. 12, an exemplary processor 1100 may include an exemplary semiconductor device. The exemplary processor 1100 may perform various functions to implement performance improvement and multifunction other than the microprocessor configured to control and adjust a series of processes, which receive and process data from various external apparatuses, and transmit a processing result to the external apparatuses. The processor 1100 may include a core unit 1110, a cache memory unit 1120, or a bus interface 1130. The core unit 1110 may perform an arithmetic and a logic operation on data input from an external source. The core unit 1110 may include a storage unit 1111, an operation unit 1112, or a control unit 1113. The processor 1100 may include a system on chips (SoCs) processor, such as a multi core processor (MCP), a GPU, or an AP.

The storage unit 1111 may include a processor register or a register. The storage unit 1111 may store data in the processor 1100 and may include a data register, an address register, or a floating point register. The storage unit 1111 may include various registers other than the above-described registers. The storage unit 1111 may temporarily store data to be operated in the operation unit 1112, resulting data processed in the operation unit 1112, or an address in which data to be processed is stored.

The operation unit 1112 may perform an operation inside the processor 1100, and may perform arithmetic or logic operations depending on a decryption result of a command in the control unit 1113. The operation unit 1112 may include one or more arithmetic and logic units (ALUs). The control unit 1113 may receive a signal from the storage unit 1111, the operation unit 1112, or an external device of the processor 1100, perform extraction or decryption of a command, or input or output control, and execute a process of a program form.

The cache memory unit 1120 may temporarily store data to supplement a data processing rate of a low speed external apparatus, unlike the high speed core unit 1110, and may include a primary storage unit 1121, a secondary storage unit 1122, or a tertiary storage unit 1123. In general, the cache memory unit 1120 may include the primary and secondary storage units 1121 and 1122, and if a high capacity storage unit is necessary, then the cache memory unit 1120 may include the tertiary storage unit 1123. If necessary, the cache memory 1120 may include more storage units. That is, the number of storage units included in the cache memory unit 1120 may be changed according to a design rule. Here, processing rates of data storage and discrimination of the primary, secondary, and tertiary storage units 1121, 1122, and 1123 may be the same as or different from each other. If the processing rates of the storage units are different, then the processing rate of the primary storage unit may is the highest. One or more of the primary storage unit 1121, the secondary storage unit 1122, and the tertiary storage unit 1123 in the cache memory unit may include an exemplary semiconductor device. The cache memory unit 1120 including the exemplary semiconductor device may include a 3D semiconductor device in which an inner portion of a vertical channel has a larger lattice constant than an outer portion of the vertical channel.

FIG. 12 illustrates that the primary, secondary, tertiary storage units 1121, 1122, and 1123 are located inside of the cache memory unit 1120. However, the primary, secondary, tertiary storage units 1121, 1122, and 1123 in the cache memory unit 1120 may be located outside of the core unit 1110, and may supplement a difference in processing rates between the core unit 1110 and an external device. Further, the primary storage unit 1121 of the cache memory unit 1120 may be located inside of the core unit 1110, and the secondary storage unit 1122 and the tertiary storage unit 1123 may be located outside of the core unit 1110 to enforce a function to compensate a processing rate.

The bus interface 1130 may couple the core unit 1110 and the cache memory unit 1120 to efficiently transmit data.

The processor 1100 according to the exemplary implementation may include a plurality of core units 1110, and the plurality of core units 1110 may share the cache memory unit 1120. The plurality of core unit 1110 and the cache memory unit 1120 may be, coupled through the bus interface 1130. The plurality of core units 1110 may have same configuration as the configuration of the above-described core unit 1110. When the plurality of core unit 1110 are provided, the primary storage units 1121 of the cache memory unit 1120 corresponding to the number of core units 1110 may be configured in the core units 1110, and the secondary storage unit 1122 and the tertiary storage unit 1123 may be configured in one body in the outsides of the core units 1110 to be shared through the bus interface 1130. Here, the processing rate of the primary storage unit 1121 may be larger than those of the secondary and tertiary storage units 1122 and 1123.

The exemplary processor 1100 may further include an embedded memory unit 1140 that may store data, a communication module unit 1150 that may transmit and receive data to and from an external device in a wired or wireless manner, a memory control unit 1160 that may drive an external storage device, or a media processing unit 1170 that may process data processed in the processor 1100 or data input from an external device and output a processing result to an external interface device. The exemplary processor 1100 may further include a plurality of modules. At this time, a plurality of added modules may transmit or receive to or from the core unit 1110, the cache memory unit 1120, or between the modules through the bus interface 1130.

The embedded memory unit 140 may include a volatile memory or a nonvolatile memory. The volatile memory may include a dynamic random access memory (DRAM), a mobile DRAM, a static random access memory (SRAM), or the like, and the nonvolatile memory may include a read only memory (ROM) a NOR flash memory, a NAND flash memory, a phase-change random access memory (PRAM), a resistive RAM (ReRAM), a spin transfer torque RAM (STTRAM), a magnetic RAM (MRAM), or the like. The exemplary semiconductor device may be applied to the embedded memory 1140.

The communication module unit 1150 may include a module configured to be coupled to a wired network and a module configured to be coupled to a wireless network nodule. The wired network module may include a local area network (LAN), a universal serial bus (USB), Ethernet, a power line communication (PLC), or the like, and the wireless network module may include Infrared Data Association (IrDA), Code Division Multiple Access (CDMA), Time Division Multiple Access (TDMA), Frequency Division Multiple Access (TDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

The memory control unit 1160 may manage data transmitted between the processor 1100 and an external device configured to operate according to a different communication standard from the processor 1100, and may include a variety of memory controllers, such as a memory controller that may control an Integrated Device Electronics (IDE), a Serial Advanced Technology Attachment (SATA), a Small Computer System Interface (SP_CSI), a Redundant Array of Independent Disks (RAID), a solid state disk (SSD), External SATA (eSATA), a Personal Computer Memory Card International Association (PCMCIA), a USB a secure digital (SD) card, a mini secure digital (mSD) card, a micro SD card, a secure digital high capacity (SDHC) card, a memory stick card, a smart media card (SM), a multi-media card (MMC), an embedded MMC (eMMC), a compact flash (CF) card, or the like.

The media processing unit 1170 may process data processed in the processor 1100 or data input from an external input device and output a processing result to an external interface device to be transferred in video, audio, or another format. The media processing unit 1170 may include a GPU, a DSP, a HD audio, a high definition multimedia interface (HDMI) controller, or the like.

Figure 13:
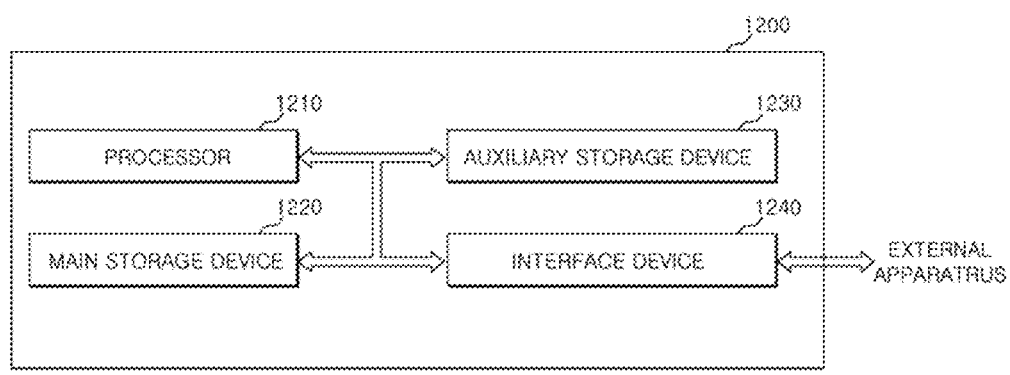
FIG. 13 is a block diagram illustrating an exemplary system.

As illustrated in FIG. 13, an exemplary system 1200 may include an exemplary semiconductor device. The exemplary system 1200 may perform an input operation, a processing operation, an output operation, a communication operation, a storage operation, or the like on data. The exemplary system 1200 may include a processor 1210, a main storage device 1220, an auxiliary storage device 1230, or an interface device 1240. The exemplary system 1200 may be a variety of electronic systems configured to operate using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 may control an interpretation of an input command and processing, such as an operation, comparison, or the like of data stored in the exemplary system 1200. The processor 1210 may be a MPU, a CPU, a single/multi core processor, a GPU, an AP, a DSP, or the like.

The main storage unit 1220 may transfer and execute a program or data from the auxiliary storage device 1230 when a program is executed. The main storage device 1220 retains the stored content in power off, and may include the exemplary semiconductor device. The main storage device 1220 may include a 3D semiconductor device in which an inner portion of a vertical channel has a lattice constant larger than that of an outer portion of the vertical channel.

An exemplary main storage device 1220 may further include an SRAM or a DRAM of a volatile memory type in which all contents are erased in power off. Alternatively, the main storage device 1220 may not include the exemplary semiconductor device, but may include an SRAM or a DRAM of a volatile memory type in which all contents are erased in power off.

The auxiliary storage device 1230 may store a program code or a data. The auxiliary storage device 1230 may have a lower data processing rate than the main storage device 1220, but may store a large amount of data and may include the exemplary semiconductor device. The auxiliary storage unit 1230 may also include a 3D semiconductor device in which an inner portion of a vertical channel has a lattice constant larger than that of an outer portion of the vertical channel.

An exemplary auxiliary storage device 1230 may reduce an area to reduce a size of the system 1200 and increase portability. Further, the auxiliary storage device 1230 may further include a data storage system (not shown) such as a magnetic tape or a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card. Alternatively, the auxiliary storage device 1230 may not include the exemplary semiconductor device, but include a data storage system (not shown), such as a magnetic tape or a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card.

The interface device 1240 may exchange a command and data of an external apparatus with the system of the exemplary implementation, and may be a keypad, a keyboard, a mouse, a speaker, a mike, a display, a variety of Human. Interface Devices (HIDs), or a communication device. The communication device may include all modules such as a module configured to be coupled to a wired network and a module configured to be coupled to a wireless network. The wired network module may include a LAN, a USB, Ethernet, a PLC, and the like, and the wireless network module may include IrDA, CDMA, TDMA, FNMA, a wireless LAN, Zigbee, a USN, Bluetooth, RFID, LTE, NFC, Wibro, HSDPA, WCDMA, UWB, or the like.

The above exemplary implementation of the present invention is illustrative and not limitative. Various alternatives and equivalents are possible. The invention is not limited by the exemplary implementation described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, the method comprising:
    forming a first semiconductor layer on a semiconductor substrate, the first semiconductor layer having a lattice constant that is larger than a lattice constant of the semiconductor substrate;
    forming a second semiconductor layer on the first semiconductor layer;
    patterning the second semiconductor layer, the first semiconductor layer, and the semiconductor substrate to form a preliminary pillar;
    forming a third semiconductor layer surrounding an outer circumference of the preliminary pillar to define a pillar;
    forming a gate insulating layer on the pillar and the semiconductor substrate;
    forming a drain in the second semiconductor layer;
    forming, below the pillar, a source in the semiconductor substrate; and
    forming a gate surrounding an outer circumference of the pillar, wherein each of the second semiconductor layer and the third semiconductor layer has a lattice constant that is smaller than a lattice constant of the first semiconductor layer.

2. The method of claim 1, wherein at least one of the semiconductor substrate, the second semiconductor layer, and the third semiconductor layer includes a silicon (Si) material.

3. The method of claim 1, wherein at least one of the semiconductor substrate, the first semiconductor layer, the second semiconductor layer, and the third semiconductor layer formed on the outer circumference of the preliminary pillar is formed through an epitaxial growth method.

4. The method of claim 1, wherein the forming the first semiconductor layer includes:
forming a first low-Ge-concentration-SiGe layer, having a concentration of Ge that is less than a concentration of Ge that forms a stoichiometric ratio of SiGe, on the semiconductor substrate; and
forming a high-Ge-concentration-SiGe layer, having a concentration of Ge that is greater than the concentration of Ge that forms the stoichiometric ratio of SiGe, on the first Ge-low concentration-SiGe layer.

5. The method of claim 4, wherein the forming the first semiconductor layer further comprises:
forming a second low-Ge-concentration-SiGe layer on the high-Ge-concentration-SiGe layer.

\* \* \* \* \*